United States Patent
Li et al.

(10) Patent No.: US 7,510,974 B2
(45) Date of Patent: Mar. 31, 2009

(54) CMP PROCESS

(75) Inventors: Chih-Yueh Li, Taipei (TW); Kai-Chun Yang, Tainan County (TW); Tzu-Yi Chuang, Kaohsiung County (TW); Chien-Hsuan Chen, Changhua County (TW); Min-Hao Yeh, Changhua County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/308,794

(22) Filed: May 5, 2006

(65) Prior Publication Data

US 2007/0259525 A1    Nov. 8, 2007

(51) Int. Cl.
   *H01L 21/302*    (2006.01)
(52) U.S. Cl. .......................... 438/692; 438/689; 451/57; 451/60; 451/41; 216/88; 216/89; 156/345.11; 156/252; 156/79
(58) Field of Classification Search ................. 438/692; 451/57; 216/88; 252/79
   See application file for complete search history.

(56) References Cited

U.S. PATENT DOCUMENTS 5,759,917 A * 6/1998 Grover et al. ............... 438/690
6,001,730 A * 12/1999 Farkas et al. ................ 438/627
6,071,816 A    6/2000 Watts et al. .................. 438/692
6,120,354 A * 9/2000 Koos et al. ..................... 451/41
6,190,237 B1 * 2/2001 Huynh et al. .................. 451/41
6,300,246 B1   10/2001 Huynh et al. ................ 438/690
6,593,240 B1 * 7/2003 Page .......................... 438/692
7,125,321 B2 * 10/2006 Prince et al. ................... 451/57
2005/0072524 A1 * 4/2005 Mueller et al. ......... 156/345.11

FOREIGN PATENT DOCUMENTS

CN    1410501    4/2003

* cited by examiner

*Primary Examiner*—Nadine Norton
*Assistant Examiner*—Maki Angadi
(74) *Attorney, Agent, or Firm*—Jianq Chyun IP Office

(57) ABSTRACT

A CMP process is provided. A first polishing process on a wafer is performed using a first hard polishing pad with a first slurry. Then, a buffering process on the wafer is performed using a soft polishing pad with a cleaning agent to buffer the pH value in the first polishing process and to remove at least portion of the first slurry and the cleaning agent by the contact with the first soft polishing pad simultaneously. Thereafter, a second polishing process on the wafer is performed using a second hard polishing pad with a second slurry such that the pH value after the buffering process is between the pH value in the first polishing process and the pH value in the second polishing process. The method can avoid the scratch issue of wafer surface by particles resulting from pH shock and cross contamination.

42 Claims, 4 Drawing Sheets

CMP PROCESS

BACKGROUND OF THE INVENTION

1. Field of the Invention

The present invention relates to a method of planarizing a wafer. More particularly, the present invention relates to a chemical-mechanical polishing (CMP) process for the planarization of a wafer.

2. Description of the Related Art

In semiconductor manufacturing, only a plane surface with very little height difference can avoid the dispersion of light and achieve a high degree of accuracy in a pattern transfer. Therefore, surface planarization is an important technique for dealing with high-density photolithography. At present, CMP is an important means for providing global planarization in the process of manufacturing integrated circuits.

CMP is a process that utilizes the reagent within a slurry to react chemically with the front face of a wafer and produce an easily polished layer. Together with the abrasive action provided by the abrasive particles in the slurry above a polishing pad, the protruding portion of the easily polished layer is gradually removed. By repeating the foregoing chemical reaction and mechanical polishing steps, the surface of the wafer is planarized. In general, a number of variables can affect the CMP process. This includes the pressure applied to the polishing head, the planarity of the wafer, the rotational speed of the wafer and the polishing pad, the chemical composition of the slurry and the abrasive particles, the operating temperature, the material and abrasive properties of the polishing pad and so on.

In most CMP process, the polishing has to be completed in two or more stages using a different polishing slurry in each step. For example, in the polishing of a shallow trench isolation (STI) structure, the silicate base slurry, like SS25 (available from Cabot Microelectronics) is applied in a polishing process to condition the external profile of a wafer. Then, high-selectivity slurry (HSS) such as the ceria base slurry, like Silect6000 (available from Cabot Microelectronics) is used in another polishing process so that the determination of the polishing end point is made clearer. Finally, de-ionized water is used to clear away any residual material on the wafer. In general, the slurries contain some active polishing ingredients such as abrasive particles. The abrasive particles are fabricated from aluminum oxide, silicon oxide or cerium oxide, for example.

It should be noted that the slurry SS25 has a pH value between 10 and 11 and the pH value of HSS is between 5 and 6. Therefore, if some residue from the slurry SS25 is directly transferred into the next polishing stage and mixed with the slurry HSS, a pH shock will occur and some of the cerium oxide and silicon oxide will congregate into lumps. Furthermore, the mixing of two different types of slurries will also contribute to a cross contamination of materials too. In addition, cerium oxide will carry a positive charge while the silicon oxide at a pH environment of about 5 will carry a negative charge. Thus, when the residue from the slurry SS25 contacts the slurry HSS (pH=5), they may clump together due to electrostatic attraction to form large particles.

FIG. 1 is a graph with curves showing the relationship between the particle size (the horizontal axis) and the frequency of appearance (the vertical axis). As shown in FIG. 1, curve 1 shows the frequency distribution of the size of the abrasive particles in the HSS slurry; curve 2 shows the frequency distribution of the size of the abrasive particles in the SS25 slurry; curve 3 shows the frequency distribution of the size of the particles and clumped particles inside the mixture formed by mixing the slurry SS25 and HSS in the ratio of 1:100; and, curve 4 shows the frequency distribution of the size of the particles and clumped particles inside the mixture formed by mixing the slurry SS25 and HSS in the ratio of 1:1000. As shown in region A of FIG. 1, any residual SS25 slurry remaining on the wafer surface can produce large particles when mixed with HSS slurry. These large particles may scratch against the wafer surface in a polishing process to produce serious damages in the wafer.

SUMMARY OF THE INVENTION

Accordingly, at least one objective of the present invention is to provide a CMP process that can avoid pH shock and cross contamination.

At least another objective of the present invention is to provide a CMP process that can prevent the scratch issue of the polished surface of a wafer.

To achieve these and other advantages and in accordance with the purpose of the invention, as embodied and broadly described herein, the invention provides a CMP process that includes the following steps. First, a first polishing process on a wafer is performed using a first hard polishing pad with a first slurry. Then, a buffering process on the wafer is performed using a soft polishing pad with a cleaning agent to buffer the pH value in the first polishing process and to remove at least portion of the first slurry and the cleaning agent by the contact with the soft polishing pad simultaneously. Thereafter, a second polishing process on the wafer is performed using a second hard polishing pad with a second slurry such that the pH value after the buffering process is between the pH value in the first polishing process and the pH value in the second polishing process.

According to one embodiment of the present invention, the soft polishing pad is fabricated using a material such as Polytex (which is Rohm and Haas's product).

According to one embodiment of the present invention, a downforce of the first soft polishing pad is about 0.1 to about 5 psi and a process time is about 1 to about 100 seconds during the buffering process.

According to one embodiment of the present invention, a second soft polishing pad may be used to clean the wafer after performing the second polishing process.

According to one embodiment of the present invention, the first slurry includes at least a polishing agent such as aluminum oxide, silicon oxide or cerium oxide, for example.

According to one embodiment of the present invention, the second slurry includes at least a polishing agent such as aluminum oxide, silicon oxide or cerium oxide, for example.

According to one embodiment of the present invention, the buffering process includes injecting the cleaning agent under pressure.

According to one embodiment of the present invention, the first slurry has a pH value smaller than 7. The second slurry has a pH value greater than 7. The cleaning agent is de-ionized water, de-ionized water or water with potassium hydroxide (KOH) or ammonia or a chemical compound having a pH value greater than 7.

According to one embodiment of the present invention, the first slurry has a pH value greater than 7. The second slurry has a pH smaller than 7. The cleaning agent is de-ionized water, de-ionized water or water with carbon dioxide ($CO_2$), citric acid or oxalic acid or a chemical compound having a pH value between 6 and 7.

The present invention also provides an alternative CMP process that includes the following steps. First, a material layer is provided over a wafer. The material layer has a first surface. Then, a first polishing process is performed to remove a portion of the material layer and expose a second surface of the material layer. The first polishing process is carried out using a first slurry. Thereafter, a buffering process is performed using a cleaning agent to clean the second surface, buffer the pH value in the first polishing process and remove at least portion of the first slurry and the cleaning agent. After that, a second polishing process is performed to remove a portion of the material layer and expose a third surface of the material layer. The second polishing process is carried out using a second slurry. Moreover, the pH value after the buffering process is between the pH value in the first polishing process and the pH value in the second polishing process.

According to one embodiment of the present invention, a process time of the buffering process is about 1 to about 100 seconds.

According to another embodiment of the present invention, the first slurry includes at least a polishing agent such as aluminum oxide, silicon oxide or cerium oxide, for example.

According to another embodiment of the present invention, the second slurry includes at least a polishing agent such as aluminum oxide, silicon oxide or cerium oxide, for example.

According to another embodiment of the present invention, the buffering process includes injecting the cleaning agent under pressure.

According to another embodiment of the present invention, the first slurry has a pH value smaller than 7. The second slurry has a pH value greater than 7. The cleaning agent is de-ionized water, de-ionized water or water with potassium hydroxide (KOH) or ammonia or a chemical compound having a pH value greater than 7.

According to another embodiment of the present invention, the first slurry has a pH value greater than 7. The second slurry has a pH smaller than 7. The cleaning agent is de-ionized water, de-ionized water or water with carbon dioxide ($CO_2$), citric acid or oxalic acid or a chemical compound having a pH value between 6 and 7.

According to above embodiments of the present invention, the CMP process may be used for shallow trench isolation (STI) CMP or Cu-CMP. When using for STI CMP, oxide removal amount is less than 200 Å or substantially zero in the buffering process.

In the present invention, a buffering process using a cleaning agent is performed between two polishing processes. The buffering process not only removes any residues on the wafer after a polishing process, but also buffers any remaining slurry on the wafer in the previous step so that pH shock and cross contamination resulting from the mixing of two different types of slurry can be avoided. As a result, there are very little residual particles or contaminants on the wafer surface to scratch and damage the wafer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 2A-1, 2B-1 and 2C-1 are top view of a CMP station.

FIGS. 2A-2, 2B-2 and 2C-2 are structural cross-sectional views of the wafers in the polishing process shown in FIGS. 2A-1, 2B-1 and 2C-1 respectively.

DESCRIPTION OF THE PREFERRED EMBODIMENTS

Figure 1:
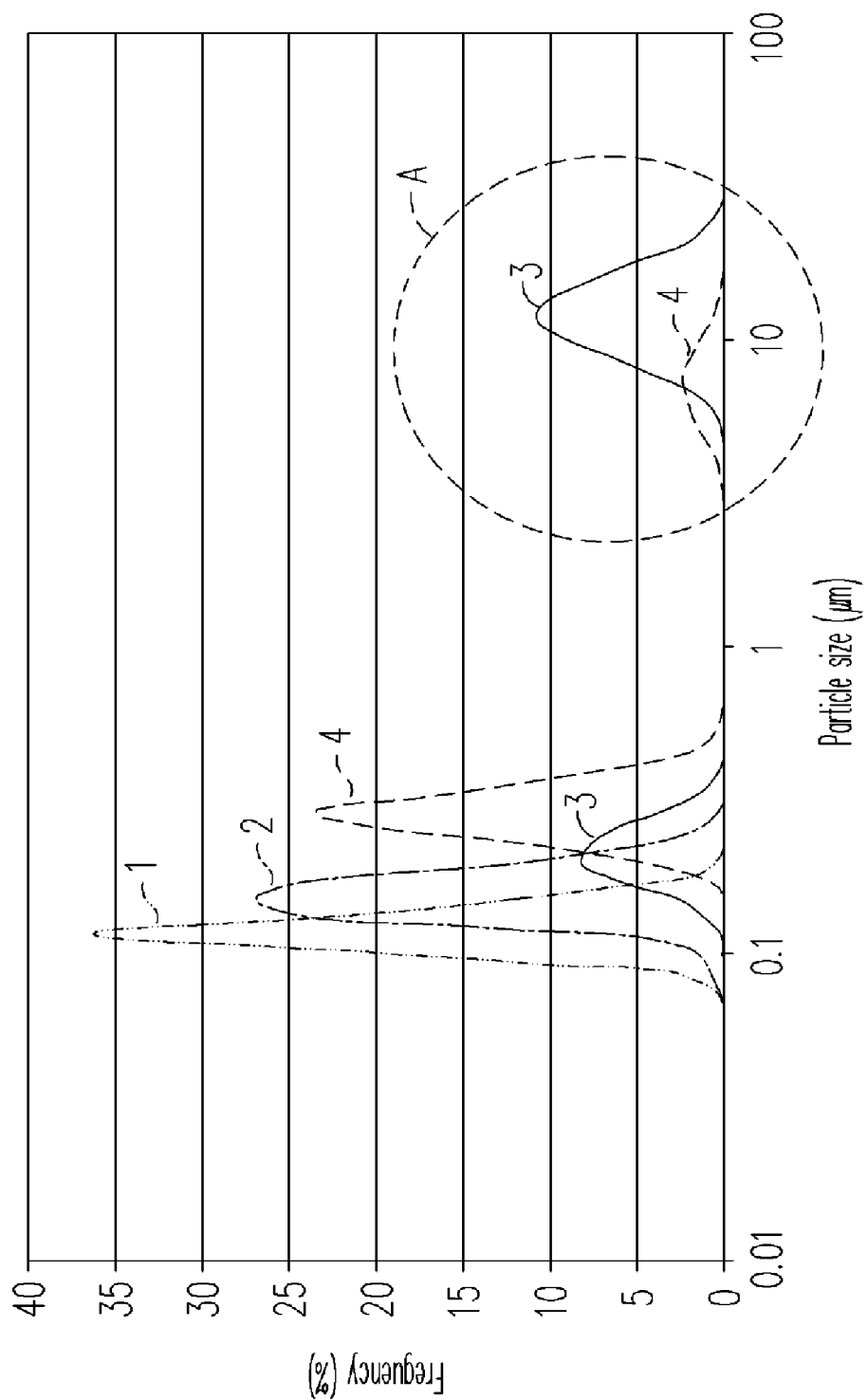
FIG. 1 is a graph with curves showing the relationship between the particle size and the frequency of appearance in pure slurries or a mixture of slurries.

Reference will now be made in detail to the present preferred embodiments of the invention, examples of which are illustrated in the accompanying drawings. Wherever possible, the same reference numbers are used in the drawings and the description to refer to the same or like parts.

Figures 1, 2A:
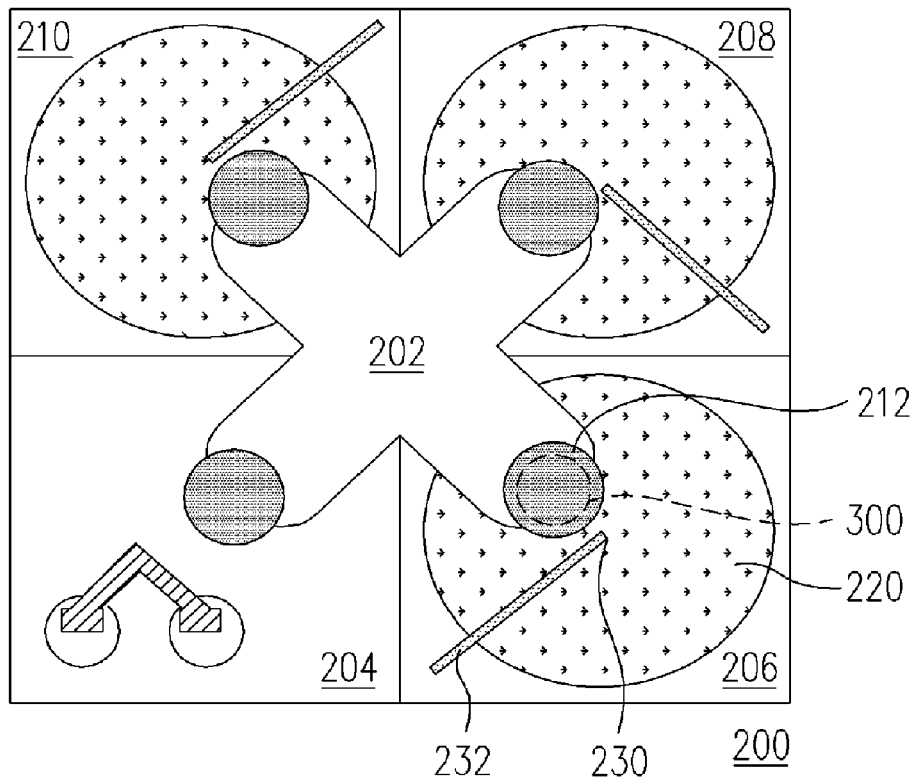
Figures 2, 2A:
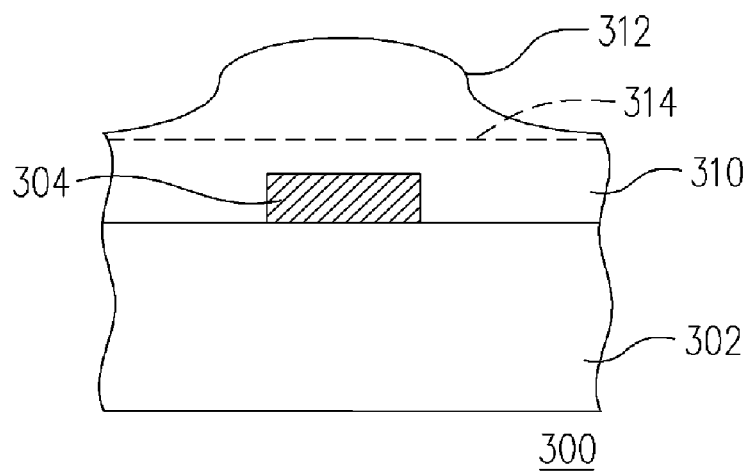
Figures 1, 2B:
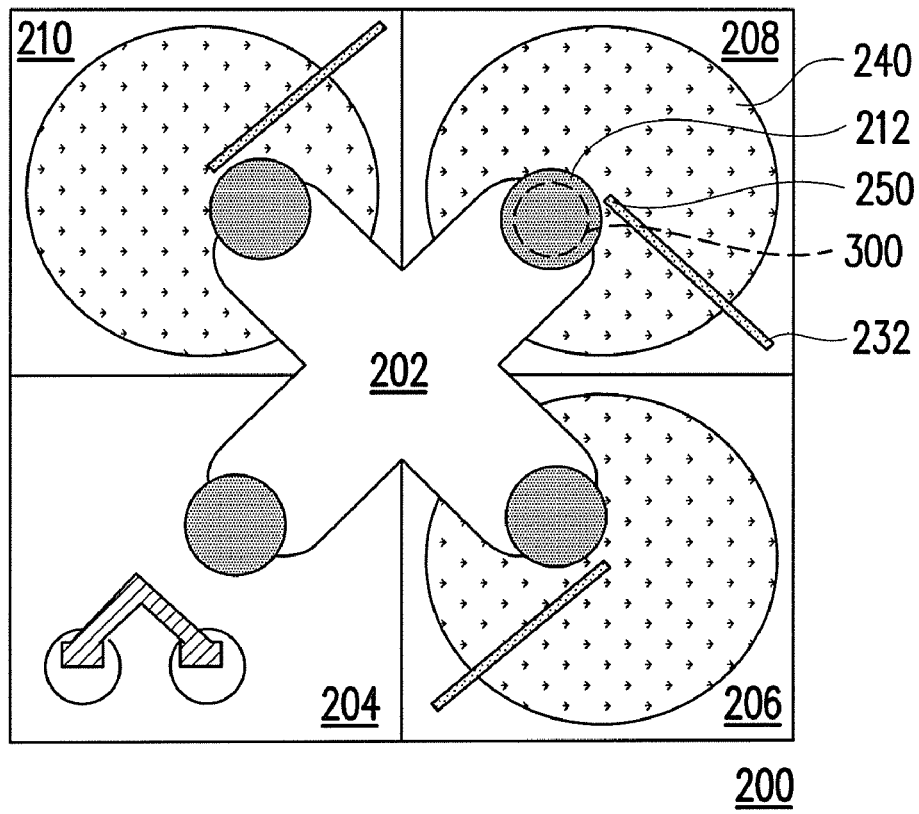
Figures 2, 2B:
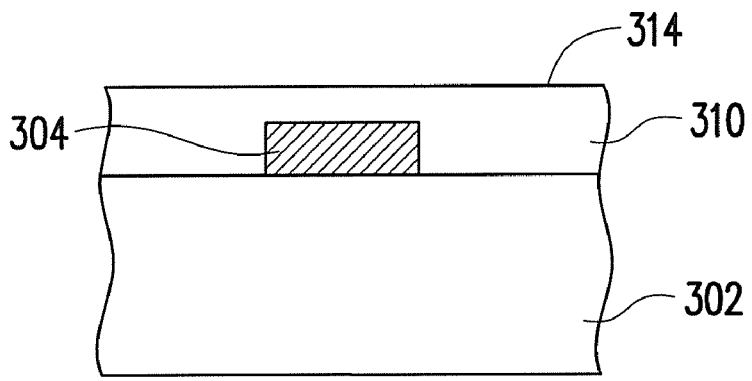
Figures 1, 2C:
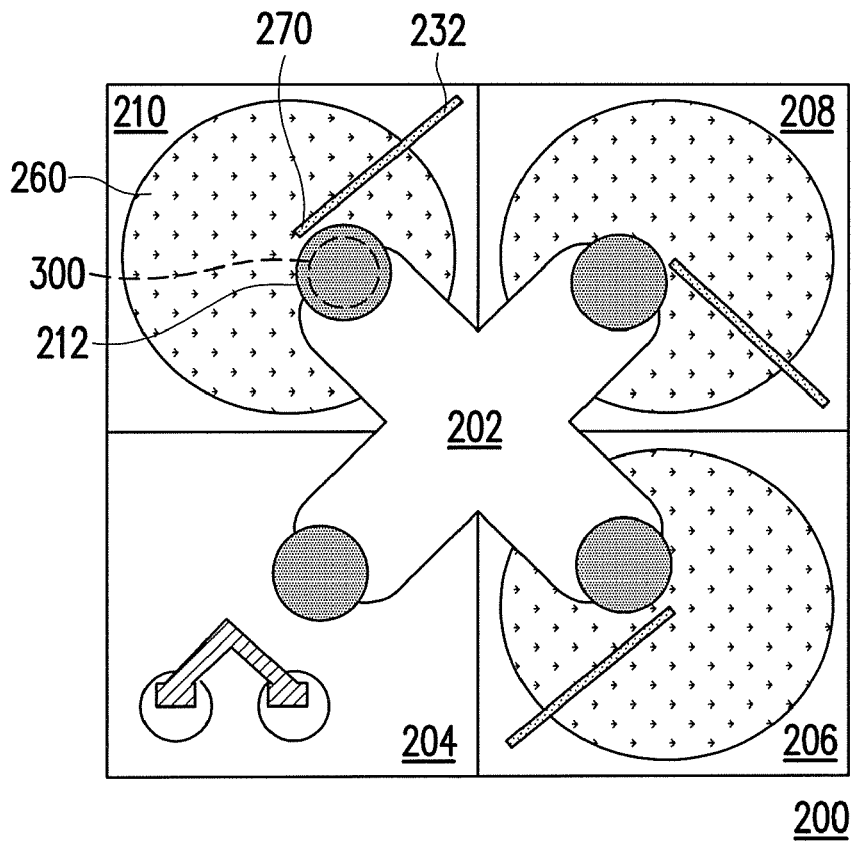
Figures 2, 2C:
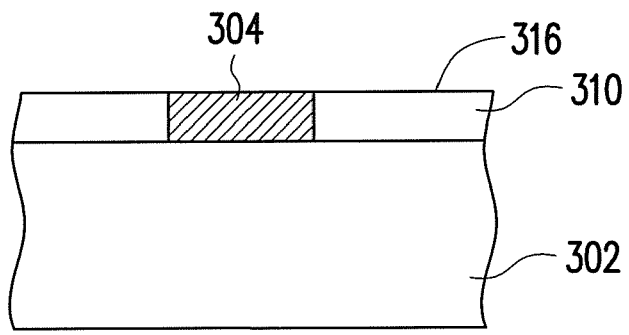

FIGS. 2A through 2C are top and cross-sectional views showing the steps for performing a CMP process according to one embodiment of the present invention. FIGS. 2A-1, 2B-1 and 2C-1 are top view of a CMP station, and FIGS. 2A-2, 2B-2 and 2C-2 are structural cross-sectional views of the wafers in the polishing process shown in FIGS. 2A-1, 2B-1 and 2C-1 respectively.

First, as shown in FIGS. 2A-1 and 2A-2, the CMP station 200 in the present embodiment has a four-axis rotational arm 202 with four processing block regions, for example. The four processing block regions include a wafer input/output region 204, a polishing region 206, a buffering region 208 and another polishing region 210. However, the present invention can be applied to other types of CMP station as well instead of limited to the one described here. In the foregoing rotational arm 202, the four terminals each has a polishing head 212 capable of sucking up a wafer 300 underneath it. The substrate 302 of the wafer 300 already has a plurality of film layers formed thereon. For example, the substrate 302 includes a first material layer 304 and a second material layer 310 fabricated from different materials. The second material layer 210 has already been planarized. Therefore, after moving the wafer 300 into the CMP station 200 through the wafer input/output region 204 (this step not shown), the wafer 300 sucked underneath the polishing head 212 is rotated into the polishing region 206 by the rotational arm 202 to perform a first polishing process.

shown in FIGS. 2A-1 and 2A-2, the polishing process includes pressing the wafer 300 on a hard polishing pad 220 within the polishing region 206 through the polishing head 212 so that a first surface 312 of the material layer 310 is in contact with the hard polishing pad 220. In the meantime, slurry 230 is delivered by a pipeline 232 and spread evenly between the hard polishing pad 220 and the wafer 300. Then, the rotational head 212 rotates the wafer 300 while the hard polishing pad 220 rotates in a counter-revolutionary direction with respect to the wafer 300 to initiate the polishing process. The hard polishing pad 220 is fabricated using a polymer material having a texture similar to a felt cloth such as a polyurethane doped poly-resin fiber. The poly-resin fiber has a degree of hardness higher than the polyurethane, and the poly-resin fiber is porous while the polyurethane is non-porous. Therefore, particular hardness and porosity requirements can be met by adjusting the ratio between the two compounds. The slurry 230 can be any slurry capable of removing the material layer 310 and adjusting the external profile rapidly. Furthermore, the slurry preferably has a pH value greater than 7 such as the slurry SS25 with a pH value between 10 and 11. In addition, the slurry 230 may include physical agents that can improve the polishing action such as abrasive particles. The abrasive particles can be fabricated using aluminum oxide, silicon oxide or cerium oxide. After the first polishing process, a portion of the material layer 310 will be removed to expose a second surface 314 in the material layer 310.

shown in FIGS. 2B-1 and 2B-2, the wafer 300 is transferred to the buffering region 208 to perform a buffering process to buffer the pH value on a surface of the wafer 300. The buffering process includes using a soft polishing pad 240 to clean the wafer 300. The method includes injecting a cleaning agent 250 on the soft polishing pad 240 under pressure while rotating the soft polishing pad 240 so that the cleaning agent 250 is spread out evenly. In one embodiment, a downforce of the soft polishing pad 240 is about 0.1 to about 5 psi. And, a process time is about 1 to about 100 seconds during the buffering process, for example. A material of the soft polishing pad 240 is such as Polytex (which is Rohm and Haas's product), whose softness must be better than the hard polishing pad 230. For example, the material of the soft polishing pad 240 has a density less than 0.8 g/cm$^3$ or a hardness less than 50 SHORE D like polyethylene. Additionally, the material of the soft polishing pad 240 may be used in a Robel Politex embossed pad, for example.

Thereafter, the material layer 310 on the wafer 300 contacts the soft polishing pad 240 so that the cleaning agent 250 on the soft polishing pad 240 can clean the second surface 314. In the meantime, at least portion of the slurry 230 (not shown) and the cleaning agent 250 may be removed by the contact with the soft polishing pad 240.

It should be noted that the cleaning agent 250 is de-ionized water, de-ionized water or water with carbon dioxide ($CO_2$), citric acid or oxalic acid or a chemical compound having a pH value between 6 and 7, for example. The function of the cleaning agent 250 is not only to remove the residual particles left behind after the previous polishing process. The cleaning agent 250 also serves to remove the slurry 230 completely so that cross contamination with the slurry in the next polishing process leading to the production of large particles (as described in the conventional process) can be avoided. In addition, the cleaning agent is specially design to cater for the previous polishing process (as shown in FIG. 2A) and the next polishing process so that the differences in the processing parameters between the two polishing processes are buffered. For example, the pH value of the residual liquid on the surface of the wafer surface can be adjusted to prevent a pH shock due to too much difference between the pH values of the slurries used in the two polishing processes.

As shown in FIGS. 2C-1 and 2C-2, the wafer 300 is transferred into another polishing region 210 for another polishing process. The polishing method is, for example, identical to the previous polishing process (shown in FIG. 2A) so that a detailed description can be omitted. One major difference is that the slurry 270 used in this polishing process can have a higher selectivity so that the slurry 270 can have a higher sensitivity for the polishing end point. The slurry 270 has a pH value smaller than 7. Preferably, the slurry 270 is a high selectivity slurry (HSS) with a pH value between about 5 and 6, such as ceria base slurry like Silect6000. Furthermore, the slurry 270 may include some abrasive particles fabricated from aluminum oxide, silicon oxide or cerium oxide, for example. Thereafter a portion of the material layer 310 is removed to expose a third surface 316 of the material layer 310. The hard polishing pad 260 and the hard polishing pad 220 can be fabricated using the same material, for example, a polymer material having felt-like softness such as doped polyurethane in poly-resin fibers. Similarly, the ratio between the polyurethane and the poly-resin fibers can be adjusted to meet particular requirements.

Additionally, after the polishing process shown in FIG. 2C, a second soft polishing pad (not shown) may be optionally used to clean the wafer 300.

The slurries and their deployment sequence in the CMP process can also be modified according to the type of material on the wafer that needs to be polished. For example, in another embodiment, if the material layer 310 is a metallic layer such as a tungsten, copper or aluminum, the slurry 230 can be an oxidizing agent such as hydrogen peroxide or acid salt of iodine that oxidizes the metallic layer and renders it easier to remove.

In yet another embodiment, the slurry 230 used in the first polishing process shown in FIG. 2A-1 can have a pH value smaller than 7. The cleaning agent 250 in the buffering process shown in FIG. 2B-1 can be used to remove any residual particles and slurry 230 on the wafer. Then, the second polishing process as shown in FIG. 2C-1 is performed using a slurry 270 having a pH value greater than 7. Thus, aside from removing any residual material on the wafer, the cleaning agent 250 must also be modified to match the slurries 230 and 270 in the previous and the subsequent polishing process. For example, the cleaning agent 250 can be de-ionized water, de-ionized water or water with potassium hydroxide (KOH) or ammonia, or a chemical compound having a pH value greater than 7.

Most importantly, the pH value after the buffering process is between the pH value of the slurry 230 in the precedent polishing process and the pH value of the slurry 270 in the subsequent polishing process, thereby buffering the pH value between the two polishing processes. Obviously, the buffering process is not limited to the description and sequence in the embodiment. The buffering process can be carried out after a particular polishing process or before carrying out a particular polishing process. Furthermore, the number of CMP processes can be varied according to the type of material layer 310 on the wafer 300 that needs to be polished.

Furthermore, the CMP process according to the present invention may be used for shallow trench isolation (STI) CMP or Cu-CMP. When using for STI CMP, oxide removal amount is less than 200 Å or substantially zero in the buffering process.

In summary, the CMP process in the present invention includes performing a buffering process between two polishing processes. The buffering process not only removes any residues on the wafer after a polishing process, but also buffers and clears away any remaining slurry on the wafer in the previous step. This prevents pH shock and cross contamination that results from a direct mixing of two different types of slurry. As a result, there are very little residual particles or contaminants on the wafer surface to scratch and damage the wafer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A CMP process, comprising the steps of:
performing a first polishing process on a wafer using a first hard polishing pad and a first slurry;
performing a buffering process on the wafer using a first soft polishing pad and a cleaning agent to buffer the pH value In the first polishing process and to remove at least portion of the first slurry and the cleaning agent by the contact with the first soft polishing pad simultaneously; and performing a second polishing process on the wafer using a second hard polishing pad and a second slurry so that the pH value after the buffering process is between the pH value in the first polishing process and the pH value in the second polishing process.

2. The CMP process of claim 1, wherein the material constituting the first soft polishing pad includes Polytex.

3. The CMP process of claim 1, wherein a downforce of the first soft polishing pad is about 0.1 to about 5 psi and a process time is about 1 to about 100 seconds during the buffering process.

4. The CMP process of claim 1, further comprises cleaning the wafer using a second soft polishing pad after performing the second polishing process.

5. The CMP process of claim 1, wherein the first slurry includes an abrasive component.

6. The CMP process of claim 5, wherein the abrasive component includes aluminum oxide, silicon oxide or cerium oxide.

7. The CMP process of claim 1, wherein the second slurry includes an abrasive component.

8. The CMP process of claim 7, wherein the abrasive component includes aluminum oxide, silicon oxide or cerium oxide.

9. The CMP process of claim 1, wherein the buffering process includes injecting the cleaning agent under pressure.

10. The CMP process of claim 1, wherein the first slurry has a pH value smaller than 7.

11. The CMP process of claim 10, wherein the second slurry has a pH value greater than 7.

12. The CMP process of claim 10, wherein the cleaning agent includes de-ionized water.

13. The CMP process of claim 10, wherein the cleaning agent includes a chemical compound having a pH value greater than 7.

14. The CMP process of claim 10, wherein the cleaning agent includes de-ionized water or water with potassium hydroxide (KOH) or ammonia.

15. The CMP process of claim 1, wherein the first slurry has a pH value greater than 7.

16. The CMP process of claim 15, wherein the second slurry has a pH value smaller than 7.

17. The CMP process of claim 15, wherein the cleaning agent includes de-ionized water.

18. The CMP process of claim 15, wherein the cleaning agent includes de-ionized water or water with carbon dioxide ($CO_2$), citric acid or oxalic acid.

19. The CMP process of claim 15, wherein the cleaning agent includes a chemical compound having a pH value between 6 and 7.

20. The CMP process of claim 1 is used for STI CMP.

21. The CMP process of claim 20, wherein oxide removal amount is less than 200 Å or substantially zero in the buffering process.

22. The CMP process of claim 1 is used for Cu-CMP.

23. A CMP process, comprising the steps of:
providing a material layer over a wafer, wherein the material layer has a first surface;

performing a first polishing process to remove a portion of the material layer and expose a second surface of the material layer, wherein the first polishing process is carried out using a first slurry;

performing a buffering process using a soft polishing pad and a cleaning agent to clean the second surface, buffer the pH value in the first polishing process and remove at least portion of the first slurry and the cleaning agent; and performing a second polishing process by using a second slurry to remove a portion of the material layer and expose a third surface of the material layer, wherein the pH value after the buffering process is between the pH value in the first polishing process and the pH value in the second polishing process.

24. The CMP process of claim 23, wherein a process time of the buffering process is about 1 to about 100 seconds.

25. The CMP process of claim 23, wherein the first slurry includes an abrasive component.

26. The CMP process of claim 25, wherein the abrasive component includes aluminum oxide, silicon oxide or cerium oxide.

27. The CMP process of claim 23, wherein the second slurry includes an abrasive component.

28. The CMP process of claim 27, wherein the abrasive component includes aluminum oxide, silicon oxide or cerium oxide.

29. The CMP process of claim 23, wherein the buffering process includes injecting the cleaning agent under pressure.

30. The CMP process of claim 23, wherein the first slurry has a pH value smaller than 7.

31. The CMP process of claim 30, wherein the second slurry has a pH value greater than 7.

32. The CMP process of claim 30, wherein the cleaning agent includes de-ionized water.

33. The CMP process of claim 30, wherein the cleaning agent includes a chemical compound having a pH value greater than 7.

34. The CMP process of claim 30, wherein the cleaning agent includes de-ionized water or water with potassium hydroxide (KOH) or ammonia.

35. The CMP process of claim 23, wherein the first slurry has a pH value greater than 7.

36. The CMP process of claim 35, wherein the second slurry has a pH value smaller than 7.

37. The CMP process of claim 35, wherein the cleaning agent includes de-ionized water.

38. The CMP process of claim 35, wherein the cleaning agent includes de-ionized water or water with carbon dioxide ($CO_2$), citric acid or oxalic acid.

39. The CMP process of claim 35, wherein the cleaning agent includes a chemical compound having a pH value between 6 and 7.

40. The CMP process of claim 23 is used for STI CMP.

41. The CMP process of claim 40, wherein oxide removal amount is less than 200 Å or substantially zero in the buffering process.

42. The CMP process of claim 23 is used for Cu-CMP.

* * * * *